(12) United States Patent
Kimijima et al.

(10) Patent No.: US 9,035,446 B2
(45) Date of Patent: May 19, 2015

(54) POWER MODULE

(71) Applicant: FUJI ELECTRIC CO., LTD., Kawasaki-shi (JP)

(72) Inventors: Daisuke Kimijima, Matsumoto (JP); Yuji Ichimura, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/262,076

(22) Filed: Apr. 25, 2014

(65) Prior Publication Data

US 2014/0319669 A1    Oct. 30, 2014

(30) Foreign Application Priority Data

Apr. 26, 2013 (JP) ................... 2013-094353

(51) Int. Cl.
| | | |
|---|---|---|
| H01L 23/22 | (2006.01) |
| H01L 23/28 | (2006.01) |
| H01L 23/42 | (2006.01) |
| H01L 23/24 | (2006.01) |
| H01L 23/36 | (2006.01) |
| H01L 23/373 | (2006.01) |
| H01L 23/498 | (2006.01) |

(52) U.S. Cl.
CPC ............... *H01L 23/42* (2013.01); *H01L 23/24* (2013.01); *H01L 2224/48091* (2013.01); *H01L 2224/48227* (2013.01); *H01L 2924/13091* (2013.01); *H01L 23/36* (2013.01); *H01L 23/3735* (2013.01); *H01L 23/3737* (2013.01); *H01L 23/49811* (2013.01)

(58) Field of Classification Search
USPC ................... 257/687, 787, 704, 784, E23.116
See application file for complete search history.

(56) References Cited

U.S. PATENT DOCUMENTS

| | | | | |
|---|---|---|---|---|
| 5,179,159 | A  * | 1/1993  | Kishita et al. ................. | 524/860 |
| 6,252,029 | B1 * | 6/2001  | Amako et al. .................... | 528/25 |
| 2003/0162038 | A1* | 8/2003  | Fukuda et al. ................ | 428/447 |
| 2007/0129492 | A1* | 6/2007  | Colborn et al. ............... | 525/100 |
| 2008/0042142 | A1* | 2/2008  | Sugawara et al. ................ | 257/77 |
| 2008/0194441 | A1* | 8/2008  | Kawata et al. ................ | 508/208 |
| 2009/0309116 | A1* | 12/2009 | Kato et al. ....................... | 257/98 |
| 2010/0193961 | A1* | 8/2010  | Konishi et al. ................ | 257/773 |
| 2012/0256220 | A1* | 10/2012 | Katayama et al. .............. | 257/98 |
| 2012/0263959 | A1* | 10/2012 | Yoshida et al. ............... | 428/447 |
| 2013/0248163 | A1* | 9/2013  | Bhagwagar et al. .......... | 165/185 |

FOREIGN PATENT DOCUMENTS

| | | |
|---|---|---|
| JP | 2000-053864 A | 2/2000 |
| JP | 2005-206761 A | 8/2005 |
| JP | 2007-126576 A | 5/2007 |

* cited by examiner

*Primary Examiner* — Nitin Parekh
(74) *Attorney, Agent, or Firm* — Rabin & Berdo, P.C.

(57) ABSTRACT

Provided is a power module. The power module includes a power semiconductor chip. The power module further includes a case that accommodates the power semiconductor chip. A silicone gel seals the power semiconductor chip within the case. The silicone gel including a heat-resistant silicone gel containing 20 to 100 mass ppm of a metal complex comprising a metal selected from a group consisting of iron and platinum.

14 Claims, 3 Drawing Sheets

POWER MODULE

CROSS-REFERENCE TO RELATED APPLICATION

This application claims the benefit of priority of Japanese patent application number 2013-094353, filed on Apr. 26, 2013, the disclosure of which is incorporated herein by reference.

TECHNICAL FIELD

The present invention relates to a power module and, more particularly, is to improve heat resistance of a power module formed by insulating and protecting a creepage of a ceramic circuit substrate with a silicone gel.

BACKGROUND ART

In recent years, a power module has been widely used in a power converter using an insulated gate bipolar transistor (IGBT) as a main device. The power module incorporates one or a plurality of power semiconductor chips to form a portion or all of a conversion connection.

Generally, the power module has a structure in which the power semiconductor chips are electrically insulated from a metal substrate or a cooling surface in such a manner that the power semiconductor chips are mounted on a ceramic insulation substrate and that the power semiconductor chips and the ceramic insulation substrate are accommodated in a case and the ceramic insulation substrate is solder-joined to a metal base plate at the same time. In order to insulate and protect a creepage of the ceramic insulation substrate and the power semiconductor chips on the substrate, a low-elastic-modulus silicone gel is filled in the case.

In an existing power module, an upper limit of an operation temperature is 150° C. However, an automobile power module or a server power module may be often used at a temperature condition exceeding 150° C. For example, Tj (temperature of jointed portion between chips) can reach instantaneously 175° C., and thus the power module is required to normally operate at such a high temperature.

In order to ensure an operation at 175° C. for 100,000 hours by an UL 1557 standard, one of lifetime acceleration test conditions listed in Table 3.1 of such a standard is selected and it is necessary to maintain an insulation breakdown withstand voltage of a product specification when being tested at the selected condition. When a heating test is performed at the lifetime acceleration test condition corresponding to the operation at 175° C. for 100,000 hours, for example, at a condition of 200° C. and 6,000 hours from Table 3.1 of UL 1557, in the existing IGBT power module, cracks occur in the silicone gel filled in the case to nearly reach the creepage of the insulation substrate and an insulation breakdown voltage is not satisfied with the standard.

In a general silicone oil or rubber, it is considered that heat resistance is improved by a method of adding filler such as carbon black, iron oxide, or titanium oxide. However, as a silicone gel material for the IGBT power module in which low viscosity and insulation properties are required, the method by the addition of the carbon black, iron oxide, titanium oxide or the like is not a way to be accepted easily since disadvantages such as reduction in the insulation properties, sedimentation of filler, or reduction in workability due to an increase of viscosity occur. Further, even in the silicone gel to which the filler for improving the heat resistance is added, the silicone gel which can achieve a lifetime acceleration test condition at 175° C. has not been found.

With respect to a silicone composition, there is a heat-resistant silicone composition prepared by dissolving or dispersing one or two or more fullerenes in silicone oil (JP 2005-206761 A). However, since the silicon composition disclosed in JP 2005-206761 A is prepared by dissolving or dispersing the fullerenes having conductivity, there is a risk of deterioration of the electrical insulation property.

DISCLOSURE OF THE INVENTION

Problem to be Solved by the Invention

The invention is intended to solve advantageously the problems described above and the object thereof is to provide a power module, which can increase heat resistance of a silicone gel filled in a case, to be used in a high-temperature environment at which the operation is not guaranteed in the past.

Means for Solving Problem

A power module of the invention includes one or two or more power semiconductor chips, a case that accommodates the power semiconductor chips, and a silicone gel that seals the power semiconductor chips filled in the case, and the silicone gel comprises of a heat-resistant silicone gel containing 20 to 100 mass ppm of at least one metal complex comprising a metal selected from a group consisting of iron and platinum.

In the power module of the invention, the metal complex may be an iron octylate. Further, in the power module of the invention, the silicone gel may be a two-component addition curing type silicone gel (also referred to as a "two-component, addition curing, silicone gel"), and the heat-resistant silicone gel may have a penetration degree of 50 to 120.

In the power module of the invention, an insulation withstand voltage may be 6 kV or higher after a lifetime acceleration test for 6,000 hours at 200° C. Further, in the power module of the invention, the power semiconductor chip may include an IGBT.

Effect of the Invention

According to a power module of the invention, the power module uses a heat-resistant silicone gel containing at least one metal complex comprising a metal selected from a group consisting of iron and platinum, thereby increasing heat resistance of the power module without reduction of insulation property and workability so that the power module having high reliability can be used at a high-temperature environment.

MODE(S) FOR CARRYING OUT THE INVENTION

Hereinafter, a power module according to an embodiment of the invention will be described in more detail with reference to the drawings.

Figure 1:
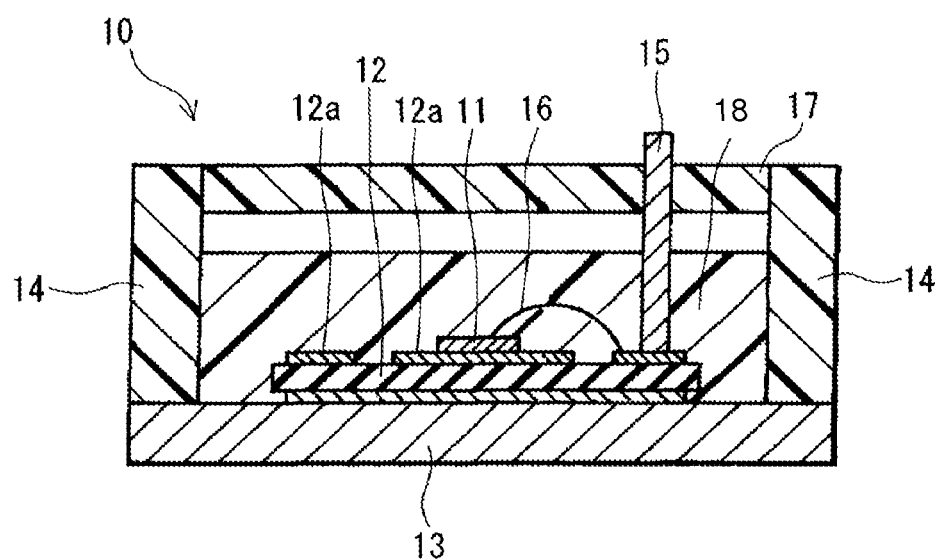
FIG. 1 is a cross-sectional view schematically illustrating a power module according to an embodiment of the invention.

An IGBT power module 10 as the power module according to the embodiment of the invention, which is a cross-sectional view schematically illustrated in FIG. 1, includes an IGBT chip 11 as a power semiconductor chip. The IGBT chip 11 is mounted on a ceramic insulation substrate 12 on which a circuit is formed by a pattern such as copper foil 12a. In FIG. 1, one IGBT chip 11 is illustrated, but the IGBT chips 11 of two or more may be arranged on the ceramic insulation substrate 12. In addition, a semiconductor chip other than the IGBT chip 11, for example, an FWD chip may be additionally arranged on the ceramic insulation substrate 12. Further, the power semiconductor chip is the IGBT chip in the embodiment illustrated in FIG. 1, but the power module of the invention may use other power semiconductor chips such as a power MOSFET chip without being limited to the IGBT chip.

The ceramic insulation substrate 12 is solder-joined to a metal base plate 13 using silicon nitride, alumina, aluminum nitride or the like as a substrate. A case 14 is bonded and fixed to a periphery of the base plate 13. The case 14 is provided so as to accommodate the IGBT chip 11 and the ceramic insulation substrate 12. For example, the case 14 is made of a thermoplastic resin such as polyphenylene sulfide (PPS). An external lead-out terminal 15 is connected to the copper foil 12a which is pattern-formed on the ceramic insulation substrate 12, and a metal wire 16, which is electrically connected to the IGBT chip 11, is connected to the copper foil 12a. Thus, the IGBT chip 11 and the external lead-out terminal 15 are electrically connected to each other. A lid 17 of the case 14 is made of the same resin as the case 14 and seals the case 14 in a state where the external lead-out terminal 15 is protruded. For insulation protection of a creepage of the ceramic insulation substrate 12 accommodated in the case 14 and the IGBT chip 11 mounted on the ceramic insulation substrate 12, a silicone gel 18 having a low elastic modulus is filled in the case 14.

In the IGBT power module 10 of this embodiment, the silicone gel 18 consists of a heat-resistant silicone gel containing at least one metal complex comprising a metal selected from a group consisting of iron and platinum.

Figure 2:
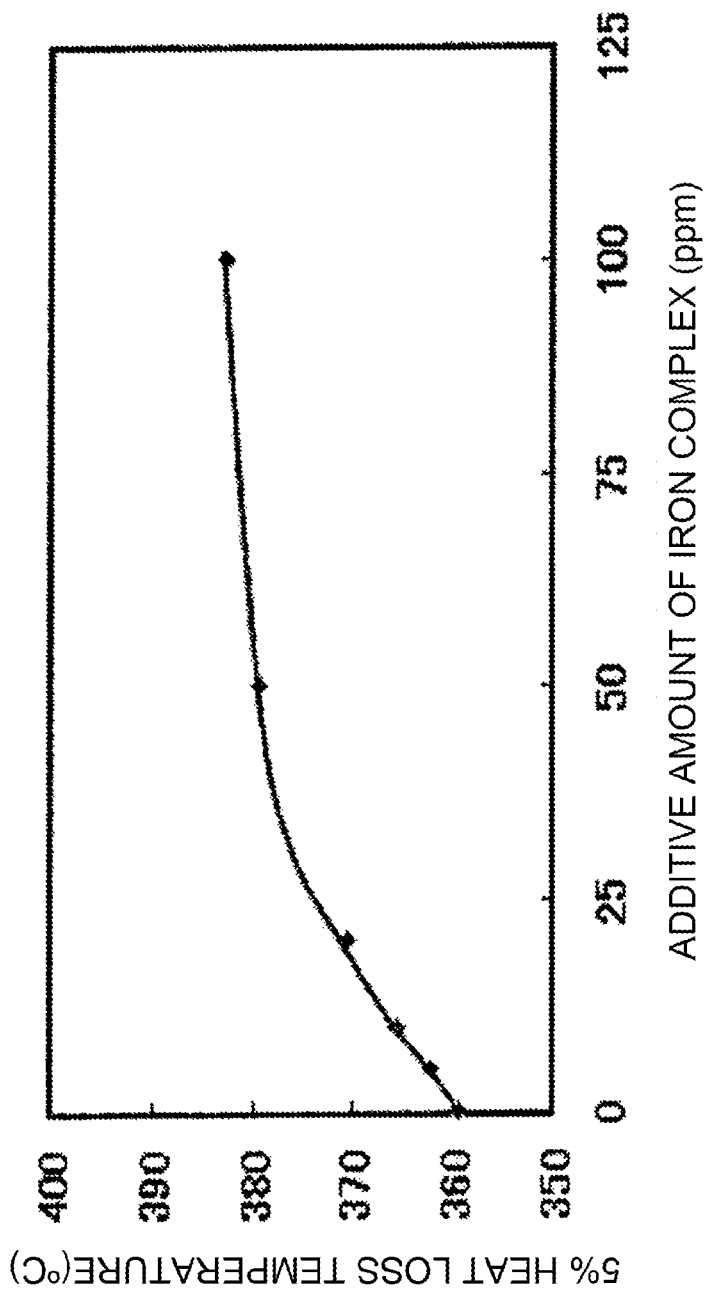
FIG. 2 is a graph illustrating a relation between an amount of an iron complex to be added to a silicone gel and a 5% heat loss temperature.

According to the research of inventors, when a metal complex such as an iron complex or a platinum complex is added to the silicone gel, a thermal decomposition temperature as an index of the heat resistance increases. FIG. 2 is a graph illustrating a relation between an amount of the iron complex to be added to the silicone gel and a 5% heat loss temperature as the thermal decomposition temperature. As can be seen from FIG. 2, it is considered that the thermal decomposition temperature rises by adding the iron complex to the silicone gel, and thus the heat resistance of the silicone gel is improved. At a high temperature of 175° C. or higher, a radical is generated in a methyl group of the general silicone gel and re-cross linked, and thus it is considered that cracks occur in the silicone gel. In contrast, since the metal complex such as the iron complex or the platinum complex has a function to trap radicals, it is considered that the silicone gel containing at least one metal complex selected from the group of metals consisting of iron and platinum can suppress curing deterioration by the re-cross linking. In addition, at least one metal complex selected from the group of metals consisting of iron and platinum has good compatibility with the silicone gel and also has excellent insulation properties as compared with an additive agent for improving the heat resistance, for example, carbon black, iron oxide, or titanium oxide.

At least one metal complex selected from the group of metals consisting of iron and platinum has an effect for trapping the radicals and suppressing the curing deterioration by the re-cross linking of the silicone gel as described above as compared with a metal complex of other metals. Therefore, the invention employs the silicone gel containing the metal complex. Ligand compounds with respect to the iron or platinum include, for example, octylic acid, naphthenic acid, stearic acid, β-diketone, or cyclic diene compound, but are not particularly limited thereto. With respect to at least one metal complex selected from the group of the metals consisting of iron and platinum, specific examples of the iron complex include iron octylate, iron naphthenate, iron stearate or the like. Examples of the platinum complex of the metal complex include a β-diketone platinum complex or a platinum complex having a cyclic diene compound as a ligand as disclosed in JP 2003 - 213132 A. For example, examples of the β-diketone platinum complex include trimethyl(acetylacetonato)platinum complex, trimethyl(2,4-pentanedionate) latinum complex, trimethyl(3,5-heptanedionate)platinum complex, trimethyl(methylacetoacetato)platinum complex, bis(2,4-pentanedionato)platinum complex, bis(2,4-hexanedionato)platinum complex, bis(2,4-heptanedionato)platinum complex, bis(3,5-heptanedionato)platinum complex, bis (1-phenyl-1,3-butanedionato)platinum complex, or bis(1,3-diphenyl-1,3-propanedionato)platinum complex. In addition, examples of the platinum complex having the cyclic diene compound as a ligand include (1,5-cyclooctadienyl)dimethyl platinum complex, (1,5-cyclooctadienyl)diphenyl platinum complex, (1,5-cyclooctadienyl)dipropyl platinum complex, (2,5-norbornadiene)dimethyl platinum complex, (2,5-norbornadiene)diphenyl platinum complex, (cyclopentadienyl) dimethyl platinum complex, (methylcyclopentadienyl)diethyl platinum complex, (trimethylsilylcyclopentadienyl) diphenyl platinum complex, (methycycloocta-1,5-dienyl) diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilyl cyclopentadienyl)trimethyl platinum complex, (dimethylphenylsilylcyclopentadienyl)triphenyl platinum complex, or (cyclopentadienyl)dimethyltrimethylsilylmethyl platinum complex. Among these metal complexes, the iron octylate has a significant effect. Therefore, the iron octylate is preferably used as the metal complex to be contained in the silicone gel to improve the heat resistance.

The content of the metal complex to be contained in the silicone gel is preferably 20 to 100 mass ppm. When the content of the metal complex is 20 mass ppm or less, a crack suppression effect expected in the invention is not sufficient. On the contrary, when the content of the metal complex exceeds 100 mass ppm, the metal complex is not uniformly dispersed in the silicone gel and remains in a state of agglomeration and sedimentation in some cases. Moreover, in this case, insulation withstand voltage is also lowered. For this reason, the content of the metal complex is in the range of 20 to 100 mass ppm.

In a case where the iron complex or the platinum complex is one-component silicone gel to facilitate additional reactions of the silicone gel, there is a possibility that a pot life is shortened. For this reason, preferably, the silicone gel to which at least one metal complex selected from the group of metals consisting of iron and platinum is added is a two-component addition curing type silicone gel consisting of two components of a main agent and a curing agent, and is more preferably a two-component addition curing type silicone gel capable of curing both of the main agent and the curing agent by the additional reaction.

As for the heat-resistant silicone gel according to the invention containing the metal complex of 20 to 100 mass ppm, it is preferable that a penetration degree of the gel after the curing be 50 to 120 (¹⁄₁₀ mm) based on JIS K 2220. When the penetration degree is less than 50, a wire break, although depends on material and diameter of a wire, easily occurs, and thus it is difficult to ensure reliability. On the other hand, when the penetration degree exceeds 120, shape stability becomes inferior and mechanical strength deteriorates, so that the crack easily occurs.

It is preferable for the silicone gel containing the metal complex to satisfy the requirements described above, and there is no particular limitation on other requirements. The composition of the silicone gel can use a silicone gel known for the power module. For example, the composition of the silicone gel can use a silicone gel having a basic structure of a dimethyl type represented by the following Chemical Formula 1, a phenylmethyl type represented by the following Chemical Formula 2, or a branched type represented by the following Chemical Formula 3.

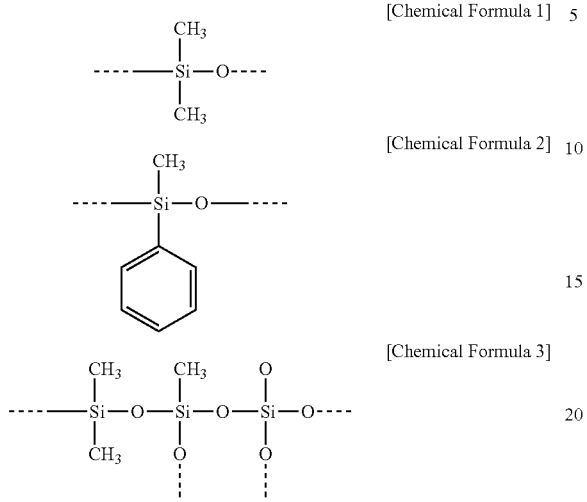

[Chemical Formula 1]

[Chemical Formula 2]

[Chemical Formula 3]

All of the above silicone gels are silicone gels having a methyl group. As a specific example of the silicone gel, there is sylgard® 527 (two-component addition curing type silicone gel) produced by Dow Corning Ltd. The sylgard® 527 is a silicone gel of the dimethyl type.

The power module 10 according to the embodiment in which the silicone gel 18 containing the metal complex is filled in the case 14 has insulation withstand voltage of 6 kV or larger without causing cracks even after a lifetime acceleration test at 200° C. for 6,000 hours which is a lifetime acceleration test corresponding to an operation guarantee temperature at 175° C. for 100,000 hours. The insulation withstand voltage may be tested using a dielectric withstand test to determine whether the power module 10 has proper insulation.

EXAMPLES

Examples of the invention will be described below, but a silicone gel to be used and a metal complex to be added to the silicone gel are not limited to Examples which will be described below. As long as the metal complex can be added to the silicone gel, any well-known materials can be used.

A two-component addition curing type silicone gel is used as the silicone gel and an iron octylate are used as an iron complex, respectively. Various silicone gels having heat resistance were prepared by adding the iron octylate to the silicone gel in a variety of additive amounts.

Figure 3:
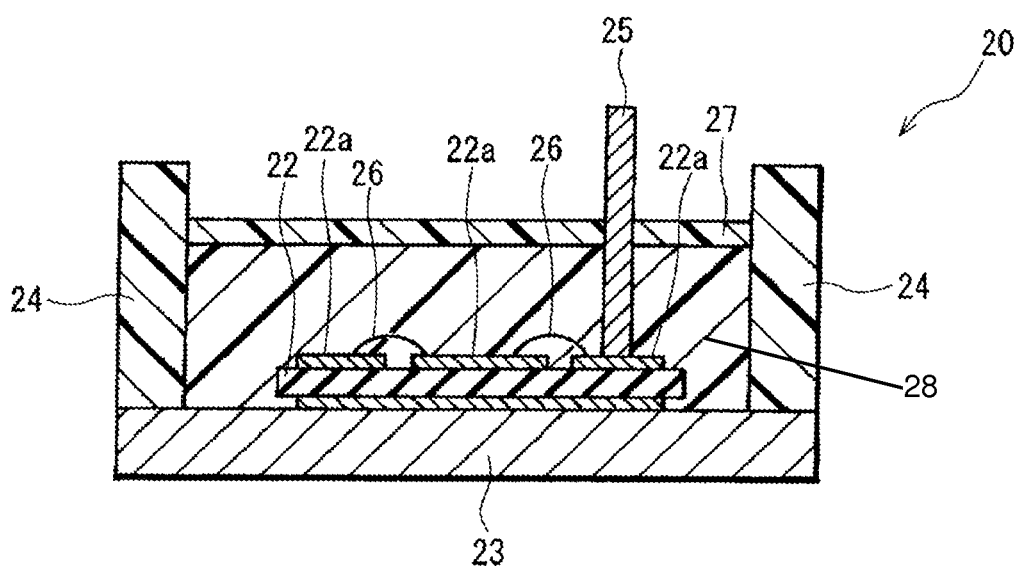
FIG. 3 is a cross-sectional view schematically illustrating an evaluation sample of the power module in Examples.

In addition, a test specimen was manufactured, in which a power module was simulated as illustrated in FIG. 3. In a test specimen 20 of FIG. 3, a metal pattern 22a is formed on both surfaces of a ceramic insulation substrate 22 made of aluminum nitride such that a creepage distance becomes 1.5 mm, and one surface of the ceramic insulation substrate 22 is soldered to a metal base plate 23. In addition, a case member is bonded to the ceramic insulation substrate 22 to form a case 24. Within the case 24, a metal terminal 25 was connected to the metal pattern 22a of the ceramic insulation substrate 22 and an aluminum wire 26 was also arranged. A lid 27 of the case 24 was made of a silicone rubber. The silicone gel 28 is disposed to completely fill the case 24.

The heat-resistant silicone gel prepared by adding the iron octylate to the above-described two-component addition curing type silicone gel in a variety of additive amounts was filled in the test specimen 20 with 40 cm³ and was vacuum-defoamed for 3 minutes under 0.2 atm. or lower. Then samples of Examples 1 to 4 and Comparative Examples 1 to 3 were obtained by heating and curing it in a hot air drying machine of 80° C. for 60 minutes.

The amount of iron octylate added to the two-component addition curing type silicone gel is as follows.

Example 1

Added the iron octylate of 20 mass ppm.

Example 2

Added the iron octylate of 50 mass ppm.

Example 3

Added the iron octylate of 75 mass ppm.

Example 4

Added the iron octylate of 100 mass ppm.

Comparative Example 1

Added no iron octylate (additive amount: 0 mass ppm).

Comparative Example 2

Added the iron octylate of 10 mass ppm.

Comparative Example 3

Added the iron octylate of 120 mass ppm.
(Evaluation Method)

After leaving each sample in the hot air drying machine of 200° C. for 6,000 hours, taking out the sample from the hot air drying machine, and then cooling it to a room temperature, it was observed the presence or absence of abnormal appearance by visual inspection and measured an insulation withstand voltage. It was determined to be normal that the crack was not occurred in the silicone gel by the visual observation.

A test of the insulation withstand voltage was carried out under the following conditions in all of Examples and Comparative Examples:
measurement temperature: 25° C.,
cut-off current: 5 mA, and
boosting condition: boosts 0.2 kV every 10 seconds from AC 2.0 kV.
(Evaluation Results)

Table 1 represents evaluation results of Examples 1 to 4 and Comparative Examples 1 to 3. In addition, with respect to the silicone gel to which the octylic acid is added, Table 1 also represents evaluation results of the insulation property, the sedimentation property of an octylic acid in the silicone gel, and the penetration degree. The insulation property of the silicone gel was evaluated using a high resistance meter 4339A manufactured by Hewlett Packard Co. The evaluation was marked by ○ when the insulation property of the silicone gel was $10^{13}$ Ωcm or more, whereas the evaluation was marked by × when the insulation property of the silicone gel was less than $10^{13}$ Ωcm. In addition, after 50 cm³ of a gel was collected in a beaker of 50 cm³ and then was left for 24 hours, the sedimentation property of the octylic acid was evaluated by visually observing whether the sedimentation of the additive agent is present on a bottom of the beaker. The evaluation was marked by ○ when the sedimentation is absent, whereas the evaluation was marked by × when the sedimentation is present. Further, after the silicone gel was heated and cured for 60 minutes in the hot air drying machine of 80° C. described above, the penetration degree of the silicone gel was evaluated by ¼ cone based on JIS K 2220.

TABLE 1

| | Example | | | | Comparative Example | | |
|---|---|---|---|---|---|---|---|
| | 1 | 2 | 3 | 4 | 1 | 2 | 3 |
| Additive amount of iron complex | 20 | 50 | 75 | 100 | 0 | 10 | 120 |
| Insulation property | ○ | ○ | ○ | ○ | ○ | ○ | ○ |
| Sedimentation property | ○ | ○ | ○ | ○ | ○ | ○ | X |
| Penetration degree (1/10 mm) | 60 | 60 | 60 | 60 | 60 | 60 | 60 |
| 200° C. after 6,000 hours Appearance | Normal | Normal | Normal | Normal | Crack | Crack | Crack |
| 200° C. after 6,000 hours Insulation withstand voltage | 10 kV or higher | 10 kV or higher | 10 kV or higher | 10 kV or higher | Less than 3 kV | Less than 3 kV | Less than 3 kV |

As represented in Table 1, when the iron octylate was added with 20 to 100 mass ppm, the cracks did not occur in the sample after 6,000 hours at 200° C. and the insulation withstand voltage was also as good as 10 kV which was in a measuring upper limit of a general withstand voltage tester.

Meanwhile, in Comparative Examples 1 and 2 in which the iron octylate was not added or was added with 10 mass ppm, the cracks occurred in the sample after 6,000 hours at 200° C. and the insulation withstand voltage was also low. Furthermore, in Comparative Example 3 in which the iron octylate was added with 120 mass ppm, the iron octylate was not uniformly dispersed and the sedimentation occurred.

The invention claimed is:

1. A power module comprising:
   a power semiconductor chip;
   a case that accommodates the power semiconductor chip; and
   a heat-resistant silicone gel that seals the power semiconductor chip within the case, the heat-resistant silicone gel containing 20 to 100 mass ppm of a metal complex comprising a metal selected from a group consisting of iron and platinum.

2. The power module according to claim 1, wherein the metal complex includes an iron octylate.

3. The power module according to claim 1, wherein the silicone gel is a two-component, addition curing, silicone gel.

4. The power module according to claim 1, wherein the silicone gel after curing has a penetration degree of 50 to 120 (1/10 mm).

5. The power module according to claim 1, wherein an insulation withstand voltage of the power module is at least 6 kV after a lifetime acceleration test being performed on the power module for 6,000 hours at 200° C.

6. The power module according to claim 1, wherein the power semiconductor chip includes an IGBT.

7. The power module according to claim 1, wherein the metal is iron.

8. The power module according to claim 1, wherein the metal is platinum.

9. The power module according to claim 1, further comprising another power semiconductor chip disposed within the case, the another power semiconductor chip being sealed by the silicone gel.

10. The power module according to claim 1, wherein the case comprises a thermoplastic resin.

11. The power module according to claim 1, wherein the silicone gel is in direct contact with a plurality of opposite sides of the power semiconductor chip.

12. The power module according to claim 1, wherein the silicone gel touches first and second surfaces of the case that are opposite each other, and the silicone gel touches third and fourth surfaces of the case that are opposite each other.

13. The power module according to claim 1, further comprising:
   a copper foil;
   a metal wire connecting the copper foil to the power semiconductor chip; and
   an external lead-out terminal having an end in direct with contact with the copper foil, the external lead-out terminal penetrating the case to have another end of the external lead-out terminal disposed outside the case.

14. The power module according to claim 1, wherein a gap is disposed between the case and the silicone gel.

* * * * *